United States Patent [19]
Miyahara

[11] Patent Number: 5,170,062
[45] Date of Patent: Dec. 8, 1992

[54] WIRE BONDING INSPECTING APPARATUS WITH MOVING IMAGING AREA

[75] Inventor: Yuichi Miyahara, Kawasaki, Japan

[73] Assignee: Kabushiki Kaisha Toshiba, Kawasaki, Japan

[21] Appl. No.: 774,886

[22] Filed: Oct. 11, 1991

[30] Foreign Application Priority Data

Oct. 12, 1990 [JP] Japan .................................. 1-273771

[51] Int. Cl.$^5$ ............................................ G01N 21/86
[52] U.S. Cl. ..................................... 250/561; 358/101
[58] Field of Search ................ 250/561; 356/376, 392, 356/393, 394; 358/101, 106, 107

[56] References Cited

U.S. PATENT DOCUMENTS

| | | | |
|---|---|---|---|
| 4,389,669 | 6/1983 | Epstein et al. ........................ | 358/101 |
| 4,739,175 | 4/1988 | Xamura ............................... | 250/561 |
| 4,872,052 | 10/1989 | Liudzius et al. ..................... | 358/106 |
| 4,874,956 | 10/1989 | Kato et al. ........................... | 250/561 |
| 4,942,618 | 7/1990 | Sumi et al. ............................. | 382/8 |
| 5,113,565 | 5/1992 | Cipolla et al. ........................ | 358/101 |

FOREIGN PATENT DOCUMENTS

| | | |
|---|---|---|
| 0123229 | 10/1984 | European Pat. Off. . |
| 59-171129 | 9/1984 | Japan . |
| 63-164533 | 1/1990 | Japan . |

Primary Examiner—David C. Nelms
Assistant Examiner—T. Davenport
Attorney, Agent, or Firm—Foley & Lardner

[57] ABSTRACT

A wire bonding inspecting apparatus for inspecting wires bonded between a semiconductor chip and leads comprises an imaging device for optically taking an image of the wire and converting the optical image into electric image signals; a moving device for moving the imaging device; an image processing inspecting unit for obtaining wire positional coordinates on the basis of image signals and inspecting the wire on the basis of the positional coordinates; and a main controller. When a whole wire does not lie within an image area of the imaging device, the moving device moves the imaging device; the imaging device takes plural optical wire images whenever moved and converts the optical images into image signals, respectively; and the image processing inspecting unit obtains the relative wire positional coordinates on the basis of the image signals whenever the optical images are taken and transforms the relative wire positional coordinates into the absolute wire positional coordinates for wire inspection, thus enabling a long wire to be inspected without adjusting the lens magnification, that is, under a constant high resolution.

4 Claims, 3 Drawing Sheets

WIRE BONDING INSPECTING APPARATUS WITH MOVING IMAGING AREA

BACKGROUND OF THE INVENTION

The present invention relates to a wire bonding inspecting apparatus, and more specifically to an apparatus suitable for use to automatize the wire bonding inspection process.

After wire bonding between a semiconductor chip and leads have been completed, it is necessary to inspect whether wires are bonded at the correct positions, in straight lines without being curved, not disconnected, etc.

If these inspections are carried out by a worker's visual inspection with a microscope, there arise various problems in that the inspection criteria differ or defects are missed dependng on the inspecting worker; a long inspection time is required from the end of wire bonding to the start of inspection without being inspected immediately, etc., so that recently wire bonding has been inspected by means of automatized inspecting apparatuses.

In the ordinary automatized inspecting apparatus, an optical image of a semiconductor chip on which wires are bonded is focused onto an image sensor and converted into electrical image signals for inspection.

In the prior art inspecting apparatus; however, there exists a problem in that the apparatus is not applicable to various lengths of bonded wires. For instance, where a wire 2 bonded to an electrode 3 of a semiconductor chip 1 is short as shown in FIG. 4, the whole bonded wire 2 lies within an image area 101, so that the bonded wire 2 can be inspected with respect to the shape, etc., by using an image within a partially enlarged image area 101 as shown in FIG. 5.

However, where the bonded wire 2a is long as shown in FIG. 6, the whole long wire cannot be seen within one image area 102. To see the whole long wire within the image area 102, the magnification of the lens of the inspecting apparatus must be reduced, thus resulting in a higher cost because the magnification must be adjusted according to the size of an object to be inspected.

In addition, since there exists a limitation in the resolution of an image apparatus or an image processing apparatus, there exists the case where it is impossible to reduce the lens magnification when a necessary inspection precision must be satisfied. In summary, in the prior art inspecting apparatus, it has been impossible to inspect bonded wires of different lengths while satisfying the high inspection precision required.

SUMMARY OF THE INVENTION

Accordingly, an object of the present invention is to provide a wire bonding inspecting apparatus which can inspect bonded wires of different lengths by the use of a constant magnification lens with under high precision.

To achieve the above-mentioned object, the wire bonding inspecting apparatus according to the present invention is an apparatus for inspecting wires bonded between a semiconductor chip and leads, characterized by being provided with: imaging means for optically taking an image of the wire and converting the optical image into electric image signals; moving means for moving said imaging means; inspecting means for obtaining positional coordinates of the wire on the basis of the converted image signals and inspecting the wire on the basis of the obtained positional coordinates; and control means for controlling the operation of said imaging means, said moving means and said inspecting means, and characterized in that: when a whole wire does not lie within a single image area obtained by said imaging means, said control means controls said moving means so as to be moved; said image means so as to take a plurality of optical images of the wire whenever moved and convert the optical images into image signals, respectively; and said inspecting means so as to obtain the positional coordinates on the basis of the image signals obtained whenever the optical images are taken, and transforms the obtained positional coordinates into those of a single uniform coordinate system for wire inspection.

When the whole wire does not lie within the single image area obtained by the imaging means, the respective means operate under control of the control means as follows: the moving means moves the imaging means; the imaging means takes a plurality of optical images of the wire whenever moved and converts the optical images into image signals, respectively; and the inspecting means obtains the positional coordinates on the basis of the converted image signals whenever the optical images are taken and transforms the obtained positional coordinates into those of a single uniform coordinate system for wire inspection. As described above, in the inspecting apparatus according to the present invention, even if the wire is long and therefore cannot be seen within one image area, since the magnification of the wire imaging means is not reduced, the wire bonding can be inspected under higher fixed lens magnification with high inspection precision.

Here, where the control means comprises discriminating means and movement position calculating means, if the discriminating means discriminates that the whole wire does not lie within the single image area obtained by the imaging means, the movement position calculating means calculates the position to which the imaging means is to be moved by the moving means.

Further, where the moving means comprises an X-Y table, a motor and an X-Y table controller, the control means controls the X-Y table controller; and the X-Y table controller controls the motor rotational operation to move the X-Y table on an X-Y plane, with a result that the imaging means moves on the X-Y plane under control of the control means.

BRIEF DESCRIPTION OF THE DRAWINGS

In the attached drawings.

DESCRIPTION OF THE PREFERRED EMBODIMENTS

An embodiment of the present invention will be described hereinbelow with reference to the attached drawings. The principal feature of the embodiment is to inspect the wire bonding by dividing the bonding wire into parts, imaging the divided parts to obtain positional coordinates, and synthesizing these positional coordinates into a single coordinates system, in case long bonded wires do not lie within one image area.

Figure 1:
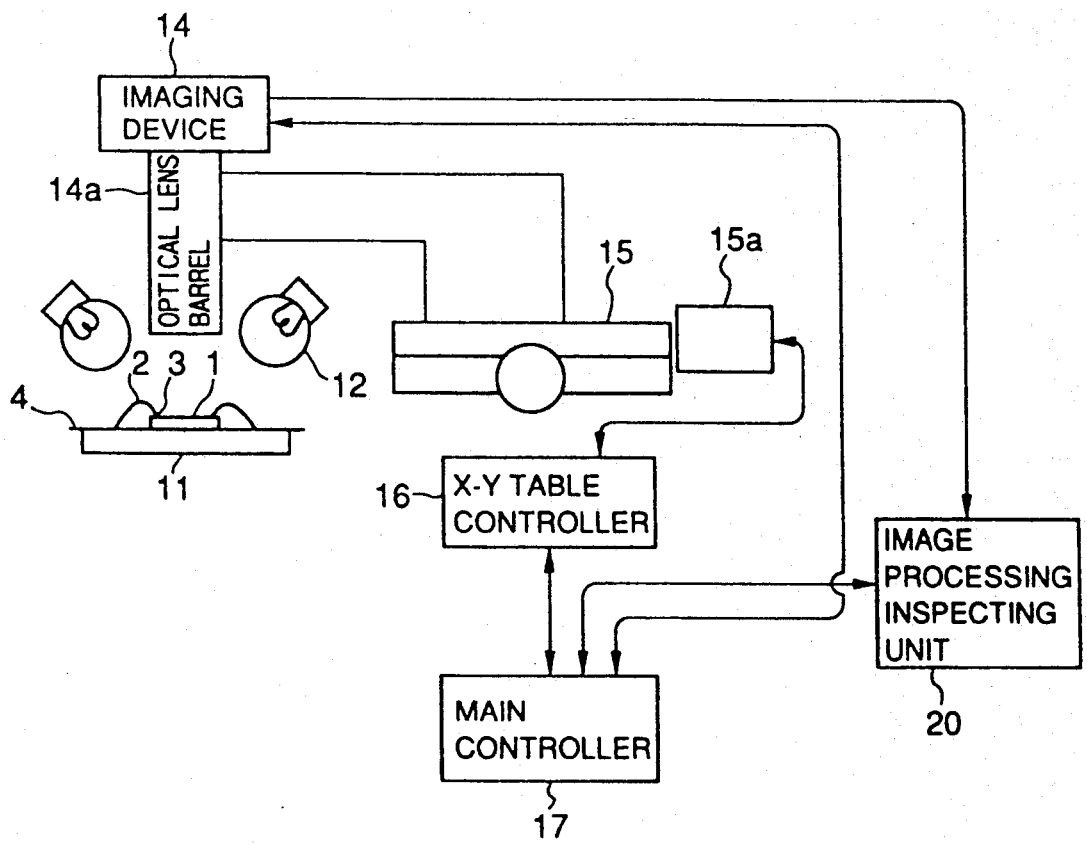
FIG. 1 is a block diagram showing an embodiment of the wire bonding inspecting apparatus according to the present invention.

FIG. 1 shows the organization of the embodiment of the wire bonding inspecting apparatus. An image pickup device or imaging device 14 including an optical lens barrel 14a is disposed over an inspection base or table 11. This imaging device 14 is fixed on an X-Y table 15, and an illuminating device 12 is provided in the vicinity of the imaging device 14. This imaging device 14 is electrically connected to an image processing inspecting unit 20. A motor 15a is provided for the X-Y table 15 to move this X-Y table 15 in both the X and Y directions. The motor 15a is electrically connected to an X-Y table controller 16 for controlling the motor operation. Further, the imaging device 14, the X-Y table controller 16 and the image processing inspecting unit 20 are all electrically connected to a main controller 17, respectively.

A semiconductor chip 1 including leads 4 and bonded wires 2 connected between the chip 1 and the leads 4 is mounted on the inspection base 11. Necessary illumination is applied by the illumination device 12 to the bonded wires 2 to be inspected. An optical image of the bonded wires 2 is focused through lenses within the optical lens barrel 14 onto the imaging device 14, by which the optical image is converted into electric image signals. These converted image signals are transmitted to the image processing inspecting unit 20, by which the signals are processed (e.g. binarization) so that the positional coordinates of the bonded wires to be inspected are detected and further inspected.

The inspected results are outputted to the main controller 17 and further transmitted to a display unit (not shown) for display. Here, the imaging device 14 is fixed to the X-Y table 15 and therefore movable on an X-Y plane. The movement of this X-Y table 15 is controlled by the X-Y table controller 16. The X-Y table controller 16 controls the drive of the motor 15a provided for the X-Y table 15 on the basis of commands from the main controller 17.

Further, in the main controller 17, inspection procedure is previously stored in order to control the operation of the imaging device 14, the X-Y table controller 16 and the image processing inspecting unit 20, respectively.

Figure 2:
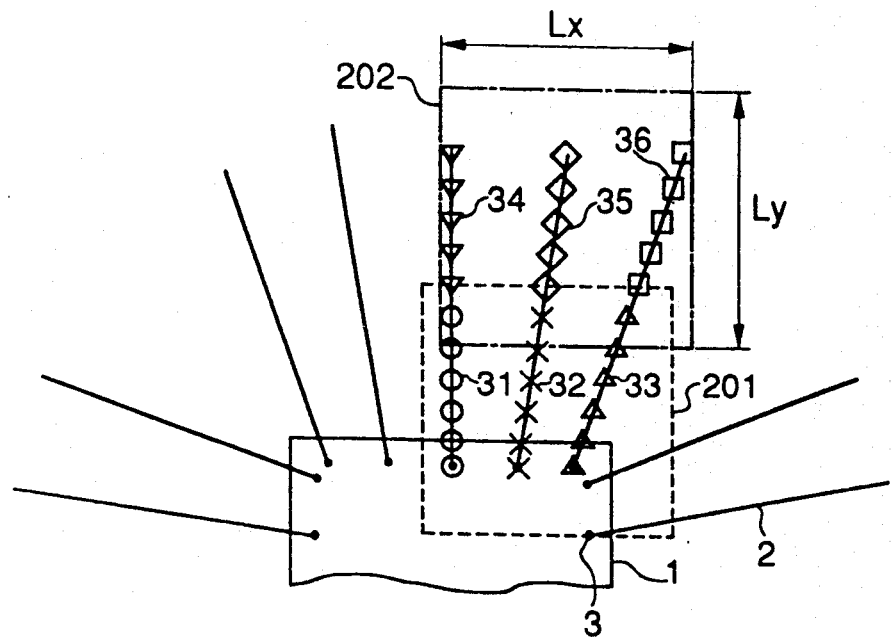
FIG. 2 is an illustration indicating the mode of taking divisional images of bonded wires by means of the apparatus shown in FIG. 1.

The operation of the inspecting apparatus constituted as described above will be described hereinbelow. First, the imaging device 14 takes or picks up an image of the semiconductor chip 1 and the wires 2 from above, as shown in FIG. 2. the dimensional data Lx and Ly of an image area in. both the longitudinal and transversal directions are stored previously in the main controller 17. Further, the length of the bonded wire 2 can be calculated on the basis of the coordinates of an electrode 3 on the semiconductor chip 1 (one end of the bonded wire 2) and the coordinates of the lead 4 (the other end of the bonded wire 2) of the main controller 17. When the length of this wire 2 is long and therefore the whole wire 2 cannot lie within a single image area of Lx x Ly, the number of divided image areas and the coordinates of the respective divided image areas are calculated by the main controller 17. For instance, in the case of the bonded wires 2 shown in FIG. 2, three bonded wires 2 are divided into two image areas 201 and 202 before being imaged.

On the basis of the commands from the main controller 17, the X-Y table controller 16 moves the X-Y table 15 so that the imaging device 14 can be moved to the first image area 201. An optical image of the bonded wires 2 is taken and converted into image signals. The converted image signals are image processed so that the respective positional coordinates 31, 32 and 33 of the bonded wires 2 can be obtained at various points, respectively. In FIG. 2, the marks of circles, crosses, triangles, squares, diamonds, etc. indicate that those positional coordinates of the wires 2 are detected in digital fashion along the respective wires.

Figure 3:
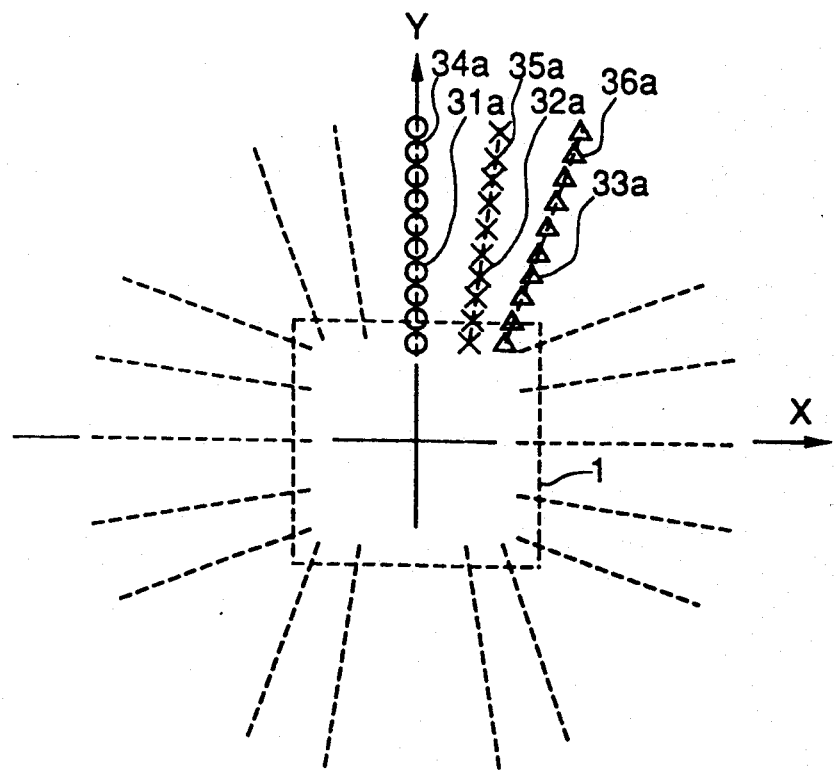
FIG. 3 is an illustration indicating the mode of transforming relative positional coordinates into those of a single absolute coordinate system by dividingly imaging the bonded wires by means of the same apparatus.
Figure 4:
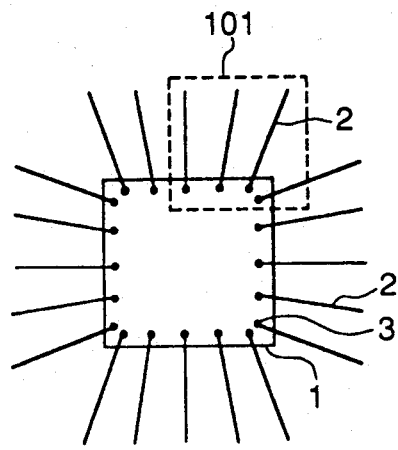
FIG. 4 is an illustration showing an image area for inspecting short bonded wires by means of a prior-art wire bonding inspecting apparatus.
Figure 5:
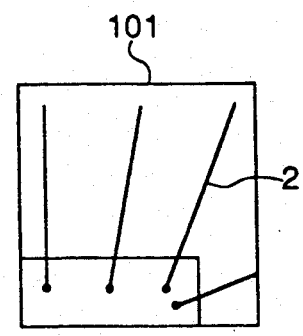
FIG. 5 is a partially enlarged view showing the image area shown in FIG. 4.
Figure 6:
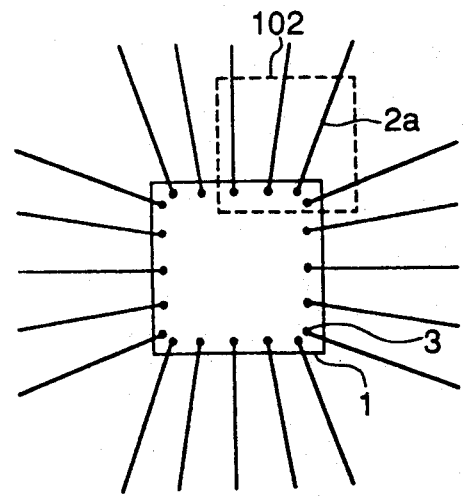
FIG. 6 is an illustration indicating the relationship between an image area for inspecting long bonded wires by means of the prior-art wire bonding inspecting apparatus and the length of the wires.

At this stage, the positional coordinates 31, 32 and 33 are data in relative different coordinate systems within the first image area 201. Therefore, the positional coordinates 31, 32 and 33 are transformed into positional coordinates 31a, 32a and 33a in an absolute uniform coordinate system determined on the basis of the semiconductor chip 1 as shown in FIG. 3 by the image processing inspecting unit 20.

Thereafter, in response to commands from the main controller 17, the X-Y table 15 is moved under control of the X-Y table controller 16, so that the imaging device 14 is moved to the second image area 202. An image of the semiconductor chip 1 and the wires 2 are taken by the imaging device 14, and the image signals are outputted. The outputted image signals are image processed by the image processing inspecting unit 20, with the result that the positional coordinates 34, 35 and 36 of the bonded wires are detected. Since these positional coordinates 34, 35 and 36 are similarly data in relative coordinate systems within the second image area 202, these coordinates are transformed into positional coordinates 34a, 35a and 36a in the absolute coordinate system as shown in FIG. 3 by the image processing inspecting unit 20.

As described above, the bonded wires 2 are divided into plural portions, and the respective divided wire portions are imaged optically and converted into image signals to obtain respective positional coordinates of the respective wires 2. Further, the relative positional coordinates obtained for each image area are transformed into the absolute positional coordinates determined on the basis of the semiconductor chip 1. Therefore, all the positional coordinates of all the bonded wires 2 at all the positions are collected as data of a single absolute coordinate system. The wires 2 are inspected on the basis of these positional coordinates in the absolute system by the image processing inspecting unit 20.

According to the present invention, since the bonded wires of different lengths can be inspected without adjusting the lens magnification, the cost of the imaging device 14 can be reduced. Further, since it is unnecessary to reduce the lens magnification when a long bonded wires are inspected, a higher inspection precision can be secured.

The above embodiment has been described by way of an example and therefore will not limit the scope of the invention. For example, in the above embodiment, three bonded wires are imaged within a single image area.

However, the number of the wires is not limited thereto, and therefore it is possible to take a wire image wire by wire. Further, it is possible to obtain a similar effect when only a specific single wire is inspected, without inspecting all of the bonded wires.

What is claimed is:

1. A wire bonding inspecting apparatus for inspecting wires bonded between a semiconductor chip and leads, comprising:

imaging means for optically taking an image of the wire and converting the optical image into electric image signals;

moving means for moving said imaging means;

inspecting means for obtaining positional coordinates of the wire on the basis of the converted image signals and inspecting the wire on the basis of the obtained positional coordinates; and control means for controlling the operations of said imaging means, said moving means and said inspecting means, and wherein when a whole wire does not lie within a single image area obtained by said imaging means, said control means controls said moving means so as to be moved; said imaging means so as to take a plurality of optical images of the wire whenever moved and convert the optical images into image signals, respectively; and said inspecting means so as to obtain the positional coordinates on the basis of the image signals obtained whenever the optical images are taken, and transform the obtained positional coordinates into those of a single uniform coordinate system for wire inspection.

2. The wire bonding inspecting apparatus of claim 1, wherein said control means comprises:

discriminating means for discriminating whether the whole wire lies within the single image area obtained by said imaging means; and calculating means for calculating the position after movement of said imaging means moved by said moving means, when said discriminating means discriminates that the whole wire does not lie within said single image area.

3. The wire bonding inspecting apparatus of claim 1 wherein said moving means comprises:

an X-Y table provided with said imaging means and being movable in an X-Y plane;

a motor for thus moving said X-Y table; and an X-Y table controller connected to said motor and controlled by said control means, for controlling the operation of said motor.

4. The wire bonding inspecting apparatus of claim 2, wherein said moving means comprises:

an X-Y table provided with said imaging means and being movable in an X-Y plane;

a motor for thus moving said X-Y table; and an X-Y table controller connected to said motor and controlled by said control means, for controlling the operation of said motor.

* * * * *